United States Patent
Shirahama et al.

(10) Patent No.: US 7,200,025 B2
(45) Date of Patent: Apr. 3, 2007

(54) SEMICONDUCTOR MEMORY DEVICE

(75) Inventors: Masanori Shirahama, Shiga (JP); Masashi Agata, Osaka (JP); Toshiaki Kawasaki, Osaka (JP); Ryuji Nishihara, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/272,818

(22) Filed: Nov. 15, 2005

(65) Prior Publication Data

US 2006/0114708 A1   Jun. 1, 2006

(30) Foreign Application Priority Data

Nov. 26, 2004   (JP)   ............... 2004-341880

(51) Int. Cl.
   *G11C 17/00*   (2006.01)
(52) U.S. Cl. ......................... 365/94; 365/205
(58) Field of Classification Search ............... 365/94, 365/205

See application file for complete search history.

(56) References Cited

U.S. PATENT DOCUMENTS

| | | | |
|---|---|---|---|
| 5,966,339 A | 10/1999 | Hsu et al. | |
| 6,384,664 B1 | 5/2002 | Hellums et al. | |
| 6,594,181 B1* | 7/2003 | Yamada | 365/185.21 |
| 7,002,829 B2* | 2/2006 | Singh et al. | 365/96 |
| 2005/0067670 A1* | 3/2005 | Hui | 257/529 |
| 2006/0039201 A1* | 2/2006 | Warner | 365/189.01 |

* cited by examiner

*Primary Examiner*—Michael Tran
(74) *Attorney, Agent, or Firm*—McDermott Will & Emery LLP

(57) ABSTRACT

Selection signals output from a decoder are selectively set at High according to the states (blown or not blown) or fuses in bit cells in a cell group specifying circuit. Then, one of transistor gates is turned ON so that a data bit cell group in/from which data is written and read out is selected. Accordingly, stored data can be rewritten multiple times by sequentially blowing the fuses in the cell group specifying circuit.

15 Claims, 10 Drawing Sheets

SEMICONDUCTOR MEMORY DEVICE

BACKGROUND OF THE INVENTION

The present invention relates to nonvolatile memories using memory devices such as a device called a one time programmable (OTP) device capable of rewiring stored information only once using a fuse.

With recent progress of miniaturization in fabrication processes of semiconductor technology, the thickness of gate oxide films has been reduced and gate electrode materials have been modified. Accordingly, the scale and integration degree of devices (memories) for rewriting, such as FLASH memories and electrically erasable programmable read-only memories (EEPROMs), have been increased, resulting in achievement of technical progress. These types of nonvolatile memories generally have high demands for the reliability of data held for a long period and, in addition, special processes other than standard CMOS (complementary metal oxide semiconductor) processes are needed for, for example, formation of floating gates. Accordingly, the fabrication cost tends to increase.

On the other hand, the area of systems using semiconductor devices includes a field in which the purposes of necessary devices have been changing. In such a field, nonvolatile memory devices or OTP devices are more and more often incorporated in products, as seen in products for security use and IC tags, for example. In existing systems, memories incorporated in system LSI and analog devices, for example, redundancy replacement using fuses in a wafer process or readjustment after packaging is needed in some cases such as redundancy addition and calibration of an analog circuit. In particular, if a device exhibits high performance with respect to frequency, adjustment in a subsequent process is inevitably needed in some cases because of a mismatch between a low-frequency test in a probe process on a wafer and an actual-frequency test after packaging. That is, to compensate for decrease in adjustment accuracy due to the influence of placing a probe itself, fine adjustment after packaging is effective in some cases.

As recent OTP fuses for applications as described above, existing laser fuses which are made of metal or polysilicon and blown with laser repair apparatus or electric fuses which are blown by causing current to flow in fuse portions are being used in view of advantages in which fabrication by standard CMOS processes is possible and reliability of written data is high, while the number of writing is limited to one (see, for example, U.S. Pat. No. 6,384,664).

As a technique that enables writing to be performed multiple times while keeping the advantages of OTP devices as described above, a technique of causing a once-written state to be inverted by performing exclusive OR (XOR) operation on a plurality of OTP devices is known (see, for example, U.S. Pat. No. 5,966,339)

The configuration in which XOR operation is performed so as to enable repeated writing, however, needs XOR circuits provided in number according to the number of possible rewriting or the number of bits, so that this configuration has a problem in which the circuit scale increases.

SUMMARY OF THE INVENTION

It is therefore an object of the present invention to enable repetitive writing without a large increase of the circuit scale.

In order to achieve this object, in a first aspect of the present invention, a semiconductor memory device includes: a plurality of data storage cells in which data is capable of being written only once; and a read selecting circuit including one or more selection storage cells in each of which data is capable of being written only once and selecting at least one of the data storage cells according to data written in the selection storage cells so as to output data according to data written in said at least one of the data storage cells selected by the read selecting circuit.

In a second aspect of the present invention, in the semiconductor memory device of the first aspect, the read selecting circuit is configured to select and output at least one of signals output from the data storage cells.

In a third aspect of the present invention, in the semiconductor memory device of the first aspect, the read selecting circuit is configured to select at least one of the data storage cells and supply a read signal to said at least one of the data storage cells selected by the read selecting circuit.

Then, different data storage cells are selected by writing data in the selection storage cell, so that data to be read, i.e., stored data, can be easily rewritten a given number of times. In addition, the circuit scale is reduced, as compared to the case of providing an XOR circuit, for example, for each data storage cell.

In a fourth aspect of the present invention, the semiconductor memory device of the first aspect further includes a write selecting circuit including one or more selection storage cells in each of which data is capable of being written only once and selecting at least one of the data storage cells according to data written in the selection storage cells so as to write data in said at least one of the data storage cells selected by the write selecting circuit.

In a fifth aspect of the present invention, the semiconductor memory device of the fourth aspect, the read selecting circuit and the write selecting circuit are configured to share the same selection storage cells.

Then, a data storage cell to which data is to be written is selected, in the same manner as that for selecting a data storage cell from which data is to be read out by writing data in the selection storage cell.

In a sixth aspect of the present invention, in the semiconductor memory device of the fifth aspect, the write selecting circuit is configured to select, for writing, one of the data storage cells different from one of the data storage cells from which data is read out by the read selecting circuit.

Then, a data storage cell in which data is to be written next is selected, so that writing in a data storage cell from which data is read out is avoided. This ensures prevention of unintentional rewiring of stored data.

In a seventh aspect of the present invention, in the semiconductor memory device of the fourth aspect, the number of the selection storage cells included in the write selecting circuit is two or more, and the write selecting circuit is configured to select at least one of the data storage cells in which data is to be written and one of the selection storage cells in the write selecting circuit, according to data written in the selection storage cells.

Then, data is selectively written in one of the selection storage cells in the write selecting circuit with ease.

In an eighth aspect of the present invention, a semiconductor memory device includes: a plurality of data storage cells in each of which data is capable of being written only once; a write selecting circuit for selecting at least one of the data storage cells and writing data in said at least one of the data storage cells selected by the write selecting circuit; and a read circuit including a flip-flop and outputting data according to the number of data storage cells in which data has been written out of the data storage cells, the flip-flop inverting an output signal thereof according to whether or not data is written in each of the data storage cells at every pulse of a pulse signal in which the number of pulses accords with the number of all the data storage cells.

Then, the output signal is inverted at every wiring in each data storage cell, so that data to be read out, i.e., stored data, is also easily rewritten. In addition, the circuit scale is also reduced, as compared to the case of providing an XOR circuit, for example, for each data storage cell. Moreover, data needs to be written only for a bit whose output after rewriting is different from that before rewriting, so that the number of rewriting is more flexible.

In a ninth aspect of the present invention, in the semiconductor memory device of the eighth aspect, the write selecting circuit is configured to select at least one of the data storage cells in which data is to be written, based on data written in the data storage cells, in inverting data output from the read circuit.

In a tenth aspect of the present invention, in the semiconductor memory device of the eighth aspect, in a state in which out of two of the data storage cells in successive priorities for writing, data has been written in one of the data storage cells and data has not been written yet in the other, the write selecting circuit selects the data storage cell in which data has not been written yet.

Then, whether writing for obtaining given read-out data is necessary or not is automatically determined and a data storage cell in which data needs to be written is automatically selected.

In an eleventh aspect of the present invention, in the semiconductor memory device of the first aspect, the data storage cells are provided in a plurality of sets such that data having a given bit length is allowed to be output.

In a twelfth aspect of the present invention, in the semiconductor memory device of the eighth aspect, the data storage cells are provided in a plurality of sets such that data having a given bit length is allowed to be output.

In a thirteenth aspect of the present invention, in the semiconductor memory device of the eleventh aspect, the data storage cells associated with the given bit length are provided in a plurality of groups associated with a plurality of words such that data of words according to an address signal is output.

In a fourteenth aspect of the present invention, in the semiconductor memory device of the twelfth aspect, the data storage cells associated with the given bit length are provided in a plurality of groups associated with a plurality of words such that data of words according to an address signal is output.

Then, data having a bit length of 8 bits to 1024 bits, for example, or data of a plurality of words is capable of being written in and read out from the semiconductor memory device. In addition, in a case where an XOR circuit, for example, is provided for each data storage cell, the number of necessary XOR circuits accords with the product of the bit length and the number of words. On the other hand, elements provided in number according to the bit length and element provided in number according to the number of words are only needed, so that the circuit scale is largely reduced.

In a fifteenth aspect of the present invention, a semiconductor memory device includes: a plurality of data storage cell groups each including a plurality of data storage cells in each of which data is capable of being written only once; a plurality of selection storage cells in each of which data is capable of being written only once; a decoder for decoding outputs from the selection storage cells; and a read selecting circuit for selecting one of the data storage cell groups according to an output from the decoder and outputting data according to data written in said one of the data storage cell groups selected by the read selecting circuit.

Then, though data is written only once in each of the selection storage cells, data is sequentially written in different ones of these selection storage cells so that the selection state of the selection storage cells as a whole changes at every data writing. Based on this data, one of the data storage cell groups is selected through the decoder, and data can be selectively read out from a data storage cell group in which new data is written. In addition, as compared to the case of providing an XOR circuit, for example, for each data storage cell, the circuit scale is reduced.

DETAILED DESCRIPTION OF THE INVENTION

Figure 1:
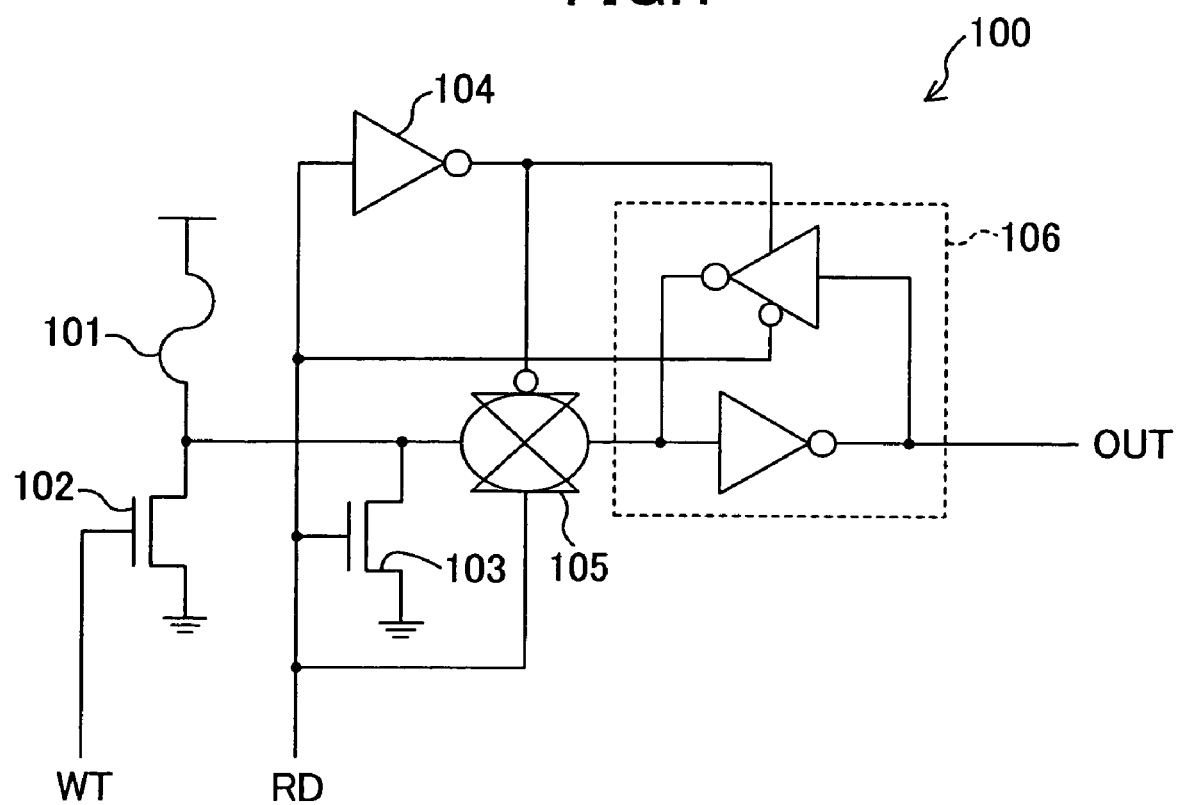
FIG. 1 is a circuit diagram illustrating a configuration of a bit cell 100 used in, for example, a semiconductor memory device according to a first embodiment of the present invention.

Hereinafter, embodiments of the present invention will be specifically described with reference to the drawings. In the following embodiments, components having the same function are denoted by the same reference numeral and the description thereof will be repeated.

EMBODIMENT 1

First, with reference to FIG. 1, a bit cell 100 used in a semiconductor memory device according to a first embodiment of the present invention will be described. In FIG. 1, reference numeral 101 denotes a fuse capable of being blown by the flow of a given amount of current. Reference numeral 102 denotes an n-channel write transistor for blowing the fuse by allowing a given amount of current to flow in the fuse 101 when a write signal (a WT signal) is at High (a high level). Reference numeral 103 denotes a read transistor for causing a potential according to whether the fuse 101 is blown or not to be generated at a drain terminal when a read signal (an RD signal) is raised to High. Reference numeral 104 denotes a NOT circuit for outputting an inversion signal inverted from the RD signal. Reference numeral 105 denotes a transfer gate circuit which turns ON (conductive) when the RD signal is at High and OFF (non-conductive) when the RD signal is at Low (a low level). Reference numeral 106 denotes a latch circuit for latching a signal level according to the potential generated at the drain terminal of the write transistor 102 when the RD signal is at High, i.e., the signal level (written data) according to whether the fuse 101 is blown or not, while the RD signal is at Low and for outputting the resultant signal as an OUT signal. The latch circuit 106 is not necessarily provided. Even in such a case, written data can be read out while the RD signal is at High. However, if the latch circuit 106 is provided to latch written data as initialization operation, it is unnecessary to flow current in the fuse 101 at every read operation, resulting in that power consumption is easily reduced.

In the bit cell 100 having the foregoing configuration, the fuse 101 is blown by setting the WT signal at High.

When the RD signal is temporarily set at High and then Low (initialization operation), the drain terminal of the read transistor 103 is at High and the OUT signal is at Low in the state where the fuse 101 is not blown, whereas the drain terminal of the read transistor 103 is at Low and the OUT signal is at High in the state where the fuse 101 is blown.

That is, the bit cell 100 serves as a one-bit nonvolatile memory cell capable of writing (rewriting) data only at once.

Figure 2:
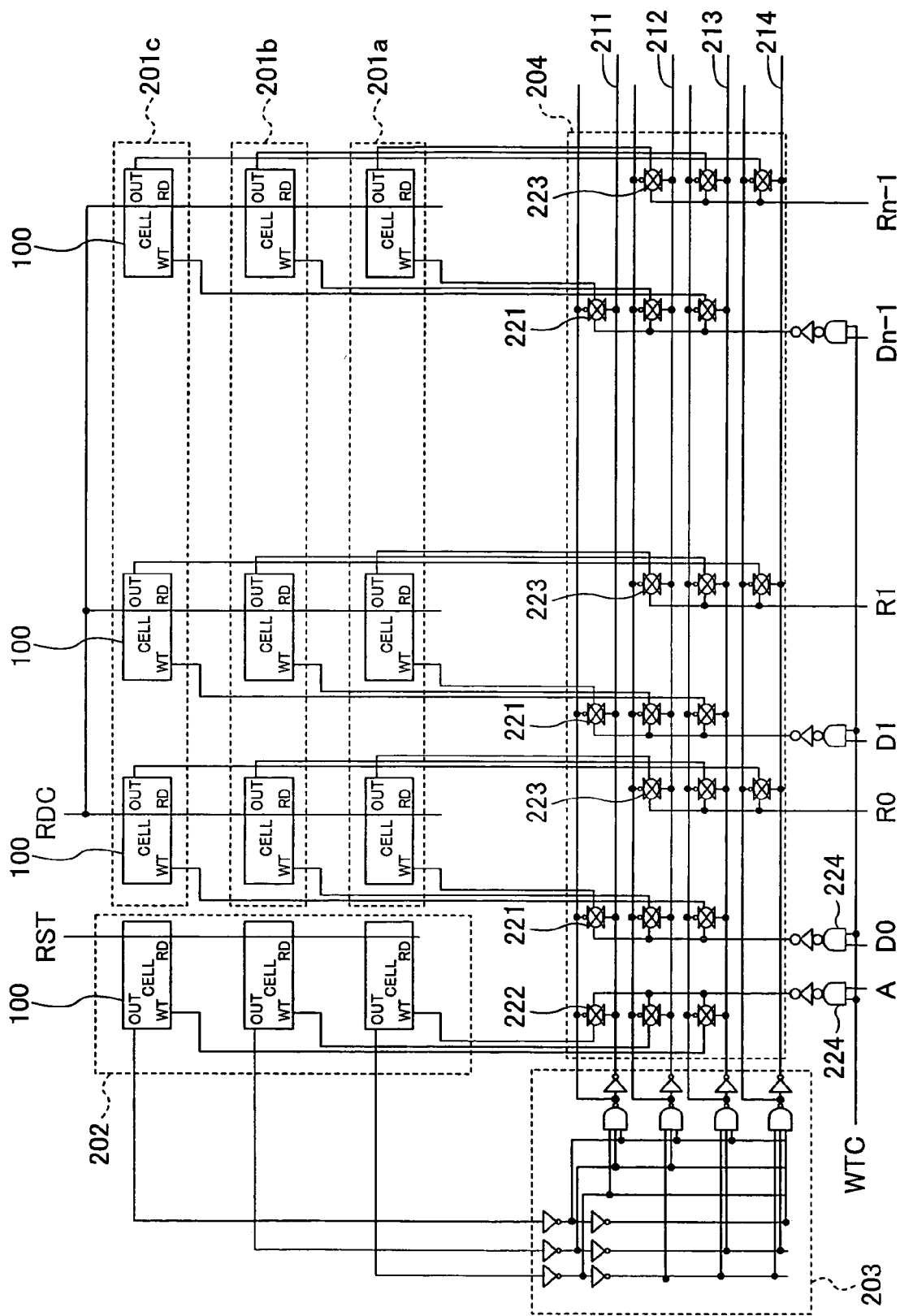
FIG. 2 is a circuit diagram illustrating a configuration of the semiconductor memory device of the first embodiment.

FIG. 2 is a circuit diagram illustrating an example of a semiconductor memory device having a configuration capable of writing n-bit data three times using 3×(n+1) bit cells (CELLs) 100 described above. In FIG. 2, reference numerals 201a through 201c denote data bit cell groups each including n bit cells 100. As RD signals for the bit cells 100, a common RDC signal is input from outside the device. Reference numeral 202 denotes a cell-group specifying circuit including three bit cells 100 and specifying one of the data bit cell groups 201a through 201c in/from which data can be written or read. As RD signals for the bit cells 100 included in the cell-group specifying circuit 202, a common RST signal is input from outside the device. Reference numeral 203 denotes a decoder for decoding an output from the cell-group specifying circuit 202 and outputting selection signals 211 through 214 and inversion signals inverted from these selection signals. Hereinafter, description of the inversion signals will be omitted if unnecessary. Reference numeral 204 denotes a selector for selecting the bit cells 100 in which data is to be written and the bit cells 100 from which data is to be read out by turning transfer gates 221 through 223 ON/OFF according to the selection signals 211 through 214 output from the decoder 203.

In the semiconductor memory device having the foregoing configuration, when the RST signal and RDC signal input to the bit cells 100 are set at High, initialization is performed and an OUT signal according to the state (blown or not blown) of the fuse 101 is output from each of the bit cells 100.

Accordingly, in the cell-group specifying circuit 202, if none of the fuses 101 in the bit cells 100 is blown, for example, OUT signals which are at Low are output from the bit cells 100, so that these OUT signals are decoded by the decoder 203 and the selection signal 211 goes High.

In the state where the selection signal 211 is at High, when a write control signal WTC rises to High and (at least part of) write data signals D0 through Dn−1 rise to High, out of WT signals input from AND circuits 224 and the transfer gates 221 in the selector 204 to the data bit cell group 201a, WT signals associated with the (at least part of) write data signals D0 through Dn−1 which are at High rise to High. Then, the fuses 101 in the bit cells 100 included in the data bit cell group 201a are blown, thereby writing data.

In the same manner, simultaneously with, or separately from, writing in the data bit cell group 201a, when the write control signal WTC rises to High and a write completion signal A rises to High, a WT signal input from an associated one of the AND circuits 224 and one of the transfer gates 222 in the selector 204 to the lowest bit cell 100 in FIG. 2 rises to High. Then, the fuse 101 in this bit cell 100 is blown, and then initialization using the RST signal is performed, so that the OUT signal from the bit cell 100 rises to High and the selection signal 212 output from the decoder 203 rises to High. In this manner, the OUT signals output from the respective bit cells 100 in the data bit cell group 201a are output as read-out data signals R0 through Rn−1 through the transfer gates 223 in the selector 204.

In the state in which the selection signal 212 is at High as described above, when the write control signal WTC rises to High, data associated with the write data signal D0 through Dn−1 is written in the data bit cell group 201b.

Thereafter, according to the states (blown or not blown) of the fuses 101 in the bit cells 100 in the cell-group specifying circuit 202, operation such as reading of written data from the data bit cell group 201b and writing in the data bit cell group 201c is performed, thereby writing data three times in total.

EMBODIMENT 2

Figure 3:
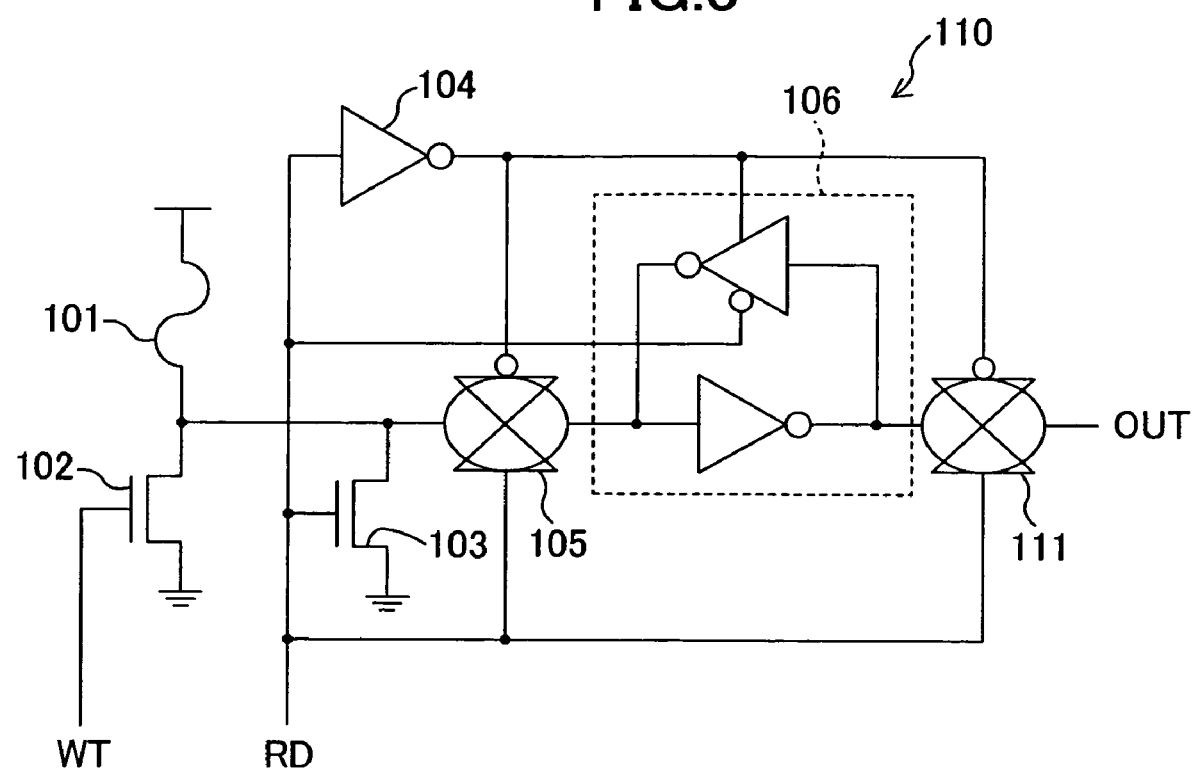
FIG. 3 is a circuit diagram illustrating a configuration of a bit cell 110 used in a semiconductor memory device according to a second embodiment of the present invention.

As illustrated in FIG. 3, in a bit cell 110 for use in holding stored data in a semiconductor memory device according to a second embodiment of the present invention, a transfer gate 111 is connected to a circuit similar to the bit cell 100 of the first embodiment such that a signal held in a latch circuit 106 is output as an OUT signal only when an RD signal is at High.

Figure 4:
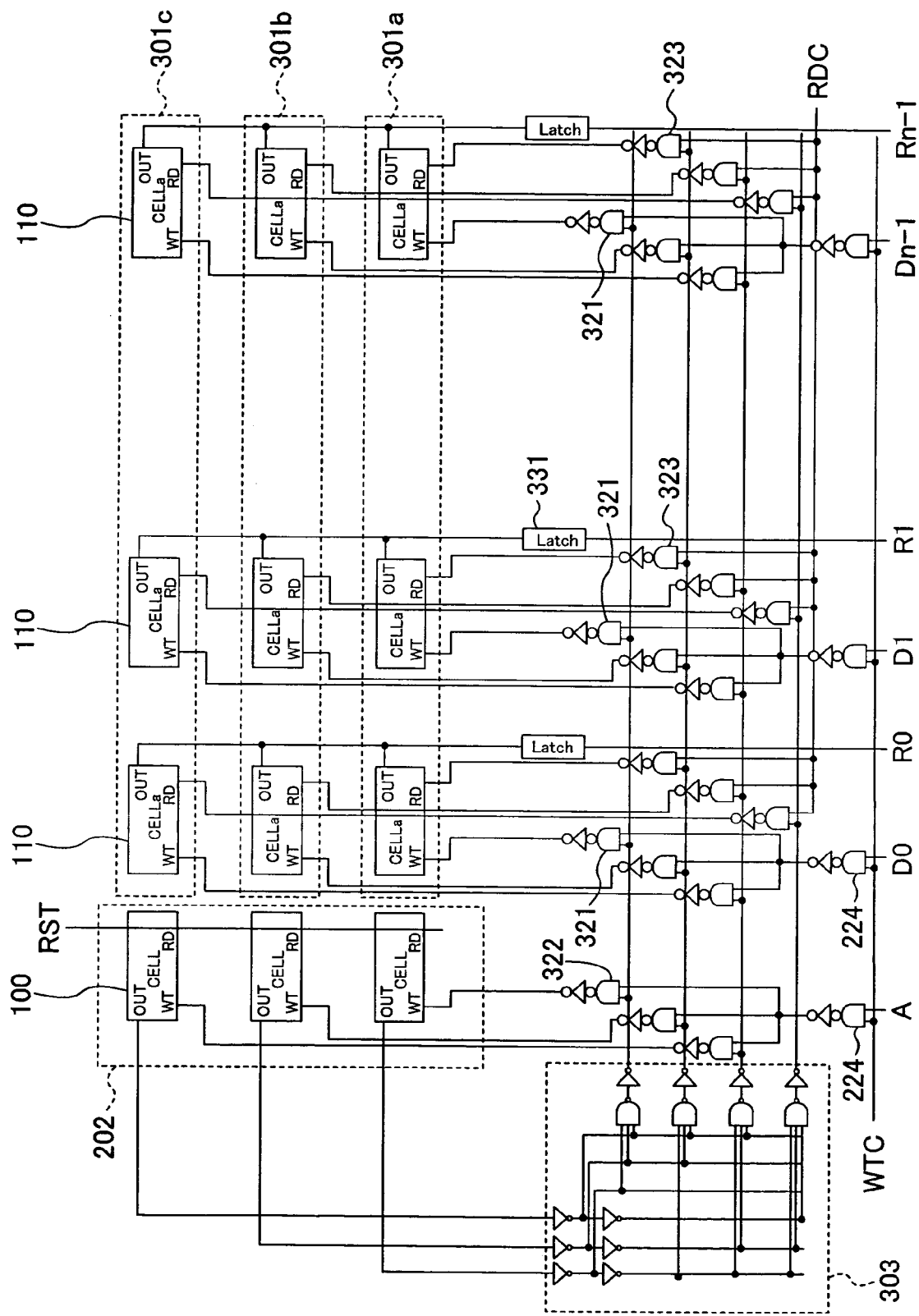
FIG. 4 is a circuit diagram illustrating a configuration of the semiconductor memory device of the second embodiment.

As shown in FIG. 4, the semiconductor memory device includes data bit cell groups 301a through 301c including 3×n bit cells 110 (CELLa). A cell-group specifying circuit 202 for specifying one of the data bit cell groups 301a through 301c in/from which data can be written or read is the same as that of the first embodiment.

The decoder 303 has a configuration similar to that of the decoder 203 of the first embodiment, but is different in that no inversion signal is output.

Writing and reading in/from the data bit cell groups 301a through 301c according to the output of the decoder 303 and writing in the cell-group specifying circuit 202 are controlled using WT signals and RD signals output from AND circuits 321 through 323.

The OUT signals output from the bit cells 110 in one of the data bit cell groups 301a through 301c are held by latch circuits 331.

In the semiconductor memory device having the foregoing configuration, operation during initialization of the cell-group specifying circuit 202 and operation during writing of data in the bit cells 100/110 are almost the same as those in the semiconductor memory device of the first embodiment. Specifically, the bit cells 100 in the cell-group specifying circuit 202 are initialized and output stored data when an RST signal input as RD signals rises to High. Based on this, one of selection signals output from the decoder 303 rises to High. Then, when a write control signal WTC changes to High and either write data signals D0 through Dn−1 or a write completion signal A rises to High, the WT signals input from the AND circuits 321 and 322 to the bit cells 110/100 in the data bit cell groups 301a through 301c or the cell-group specifying circuit 202 rise to High. Then, the fuses 101 in the bit cells 110/100 are blown, thereby writing data.

On the other hand, in performing initialization for reading stored data, when an RDC signal is set at High, RD signals output from the AND circuits 323 to which a selection signal which is at High out of the selection signals output from the decoder 303 is input rise to High. That is, RD signals input only to the bit cells 110 included in one of the data bit cell groups 301a through 301c rise to High. Accordingly, OUT signals according to whether the fuses 101 in the bit cells 110 are blown or not are output and latched by the latch circuits 331 according to a latch signal (not shown), thereby outputting the resultant signals from the semiconductor memory device as read-out data signals R0 through Rn−1.

As described above, during initialization for reading stored data, not RD signals input to all the bit cells 110 but only RD signals input to the bit cells 110 in one of the data bit cell groups 301a through 301c selected according to the signal from the decoder 303 are set at High, so that the amount of current flowing during initialization is reduced.

EMBODIMENT 3

Figure 5:
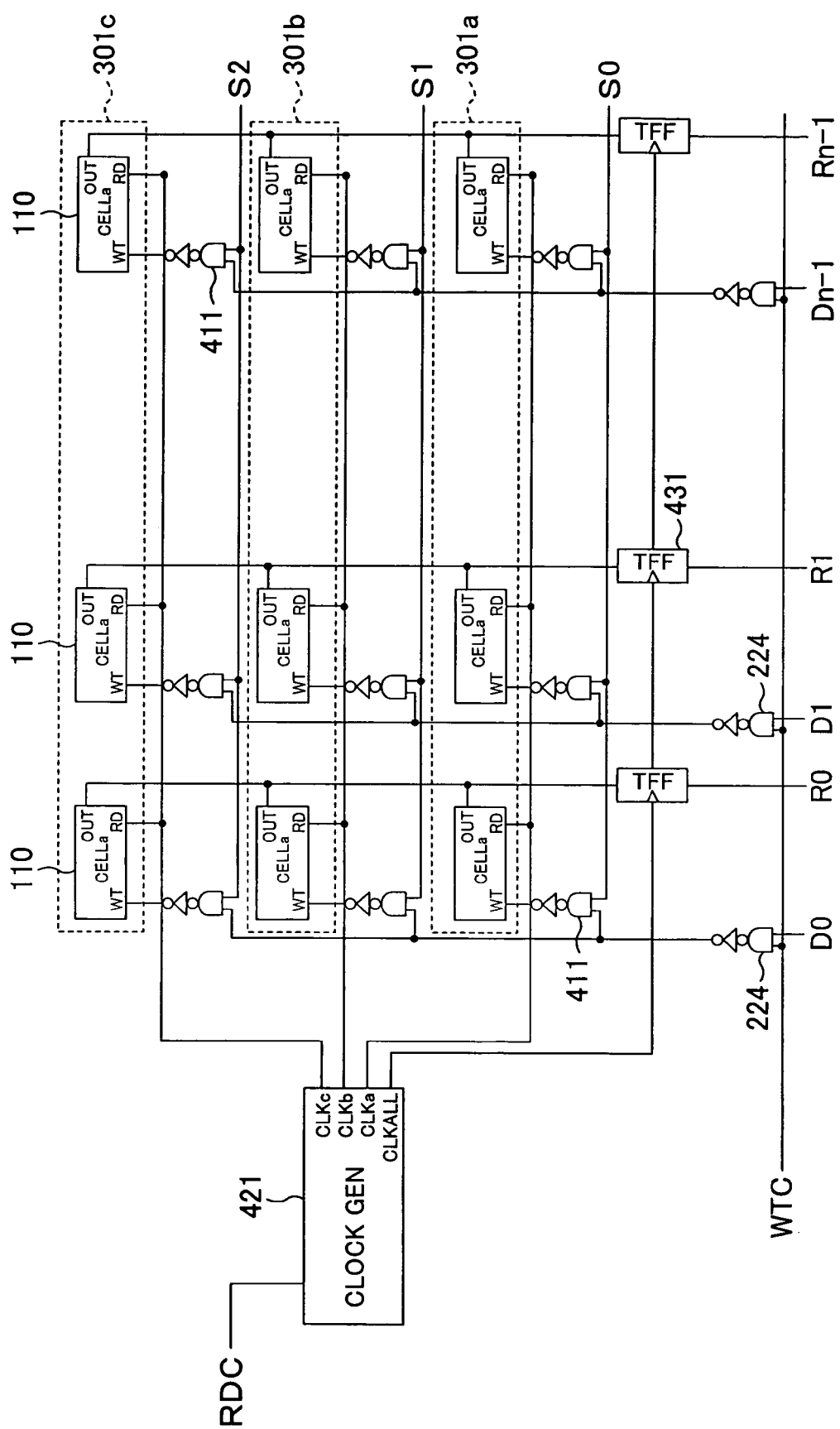
FIG. 5 is a circuit diagram illustrating a configuration of a semiconductor memory device according to a third embodiment of the present invention.

FIG. 5 is a circuit diagram showing a configuration of a semiconductor memory device according to a third embodiment of the present invention. The semiconductor memory device is configured to store data depending on the number of blown fuses 101 among three bit cells 110 for each bit.

Specifically, in the semiconductor memory device, 3×n bit cells 110 are provided as in the semiconductor memory device of the second embodiment and OUT signals output from each three bit cells 110 arranged vertically in FIG. 5 are input to a T flip-flop 431. Clock signals CLKa through CLKc output from a clock generator 421 are input to the respective bit cells 110 as RD signals, whereas a clock signal CLKALL synthesized from the clock signals CLKa through CLKc is input to the T flip-flop 431.

Figure 6:
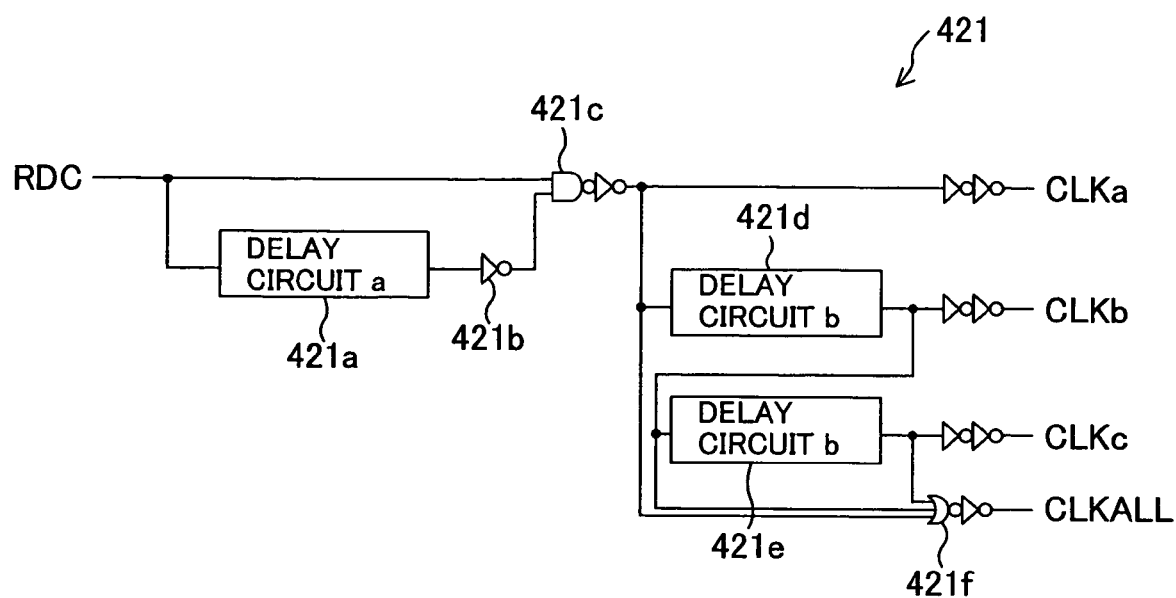
FIG. 6 is a circuit diagram illustrating a configuration of a clock generator 421 of the semiconductor memory device of the third embodiment.
Figure 7:
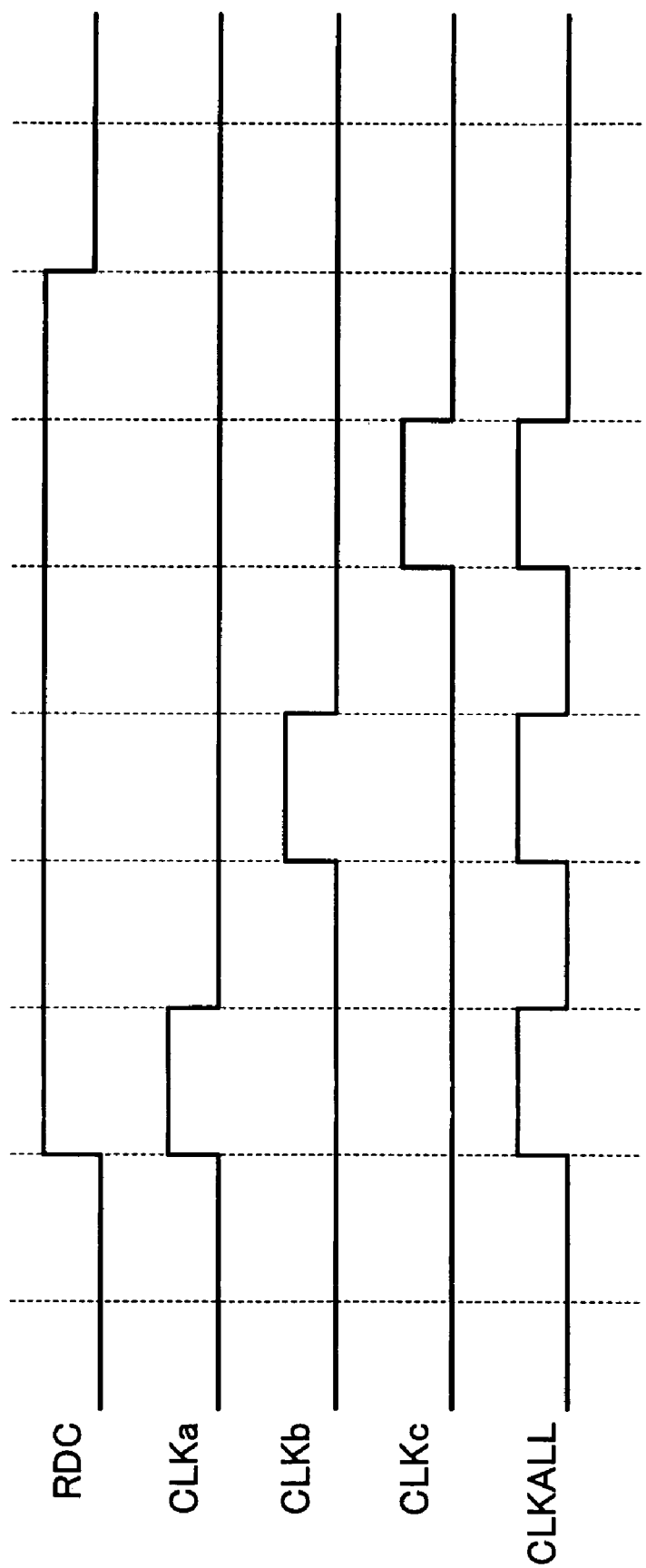
FIG. 7 is a timing chart showing operation of the clock generator 421 of the semiconductor memory device of the third embodiment.

More specifically, as illustrated in FIG. 6, for example, the clock generator 421 includes: a delay circuit 421a; a NOT circuit 421b; an AND circuit 421c; delay circuits 421d and 421e; and an OR circuit 421f. As shown in FIG. 7, the clock generator 421 outputs clock signals by generating, delaying and synthesizing one-shot pulses, based on an RDC signal which is at High during a predetermined period.

As WT signals for the bit cells 110, the outputs of AND circuits 411 are used. Selection signals S0 through S2 and the AND of a WTC signal and write data signals D0 through Dn−1 are input to the AND circuits 411.

With respect to operation of the semiconductor memory device having the foregoing configuration, first, read operation for each bit will be described. When an RDC signal input to the delay circuit 421a goes High, the clock signals CLKa through CLKc sequentially rise to High and the bit cells 110 included in the data bit cell groups 301a through 301c sequentially change to output states. Specifically, if the fuses 101 are blown, the bit cells 110 output OUT signals which are at High. The T flip-flop 431 outputs an inverted signal at each of the rising edges of the clock signal CLKALL in the state where the OUT signals are at High. Accordingly, read-out data signals R0 through Rn−1 at levels according to the number of blown fuses 101 in the three bit cells 110 are output.

On the other hand, writing in the semiconductor memory device is performed by setting, at High, the WTC signal and one of write data signals D0 through Dn−1 for a bit for which the output signal level is to be inverted and also setting, at High, one of selection signals S0 through S2 for the bit cell 110 in which the fuses 101 have not been blown yet out of the three bit cells 110 so as to rise a WT signal output from the AND circuit 411 to High. That is, as described above, the level of each of the read-out data signals R0 through Rn−1 is determined by the number of blown fuses 101 in the three bit cells 110 and is not directly affected by which one of the fuses 101 are blown. Accordingly, it is possible to rewrite data such that the output signal is inverted up to three times for each bit.

As described above, data is stored according to the number of blown fuses 101 for each bit, so that the number of rewriting is more flexible. In addition, it is sufficient to provide bit cells 110 in a number according to the number of rewriting for each bit and a clock generator for generating a clock signal having the same number of phases as the bit cells 110. Accordingly, the circuit scale and the area of the semiconductor substrate are easily reduced.

EMBODIMENT 4

In a case where data is stored according to the number of blown fuses as in the semiconductor memory device of the third embodiment, it is sufficient to blow fuses associated with a bit for which the output signal before writing is the inverse of that after writing. Accordingly, if the signal level output before writing and the signal level to be output after writing are compared with each other and a WT signal is set at High only when these signal levels are different, appropriate writing is performed only by specifying the signal level to be output after writing (without the necessity of user's consideration of the state before writing). In inversing an output signal, since it is sufficient to blow one of the fuses which are not blown, a WT signal to be input to a bit cell including a fuse to be blown next is automatically set at High according to the state (blown or not blown) of the fuse in each of the bit cells, so that writing is performed without inputting selection signals S0 through S2, i.e., without user's consideration of selecting a bit cell including a fuse to be blown.

Figure 8:
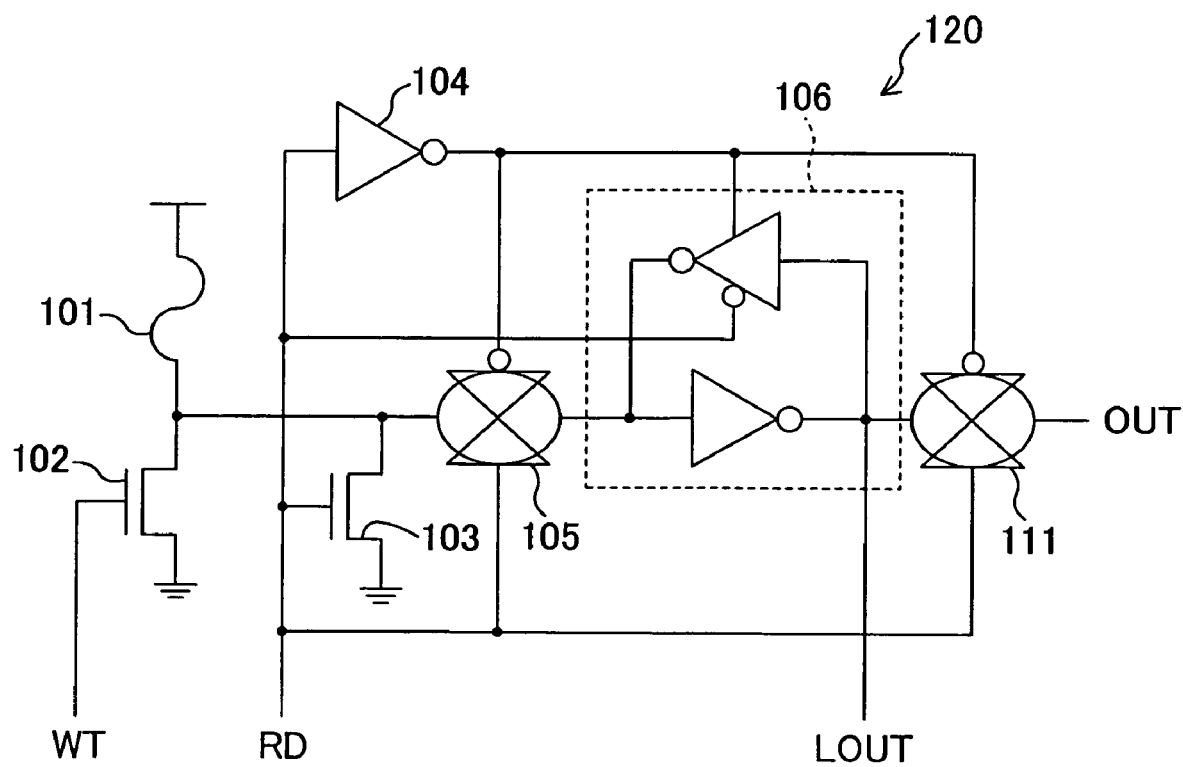
FIG. 8 is a circuit diagram showing a configuration of a bit cell 120 used in a semiconductor memory device according to a fourth embodiment of the present invention.

Specifically, as illustrated in FIG. 8, each of bit cells 120 for use in holding stored data in a semiconductor memory device according to a fourth embodiment of the present invention is configured such that an output from a latch circuit 106 in the bit cell 110 (shown in FIG. 3) of the second embodiment is output as a LOUT signal (without passing through a transfer gate 111).

Figure 9:
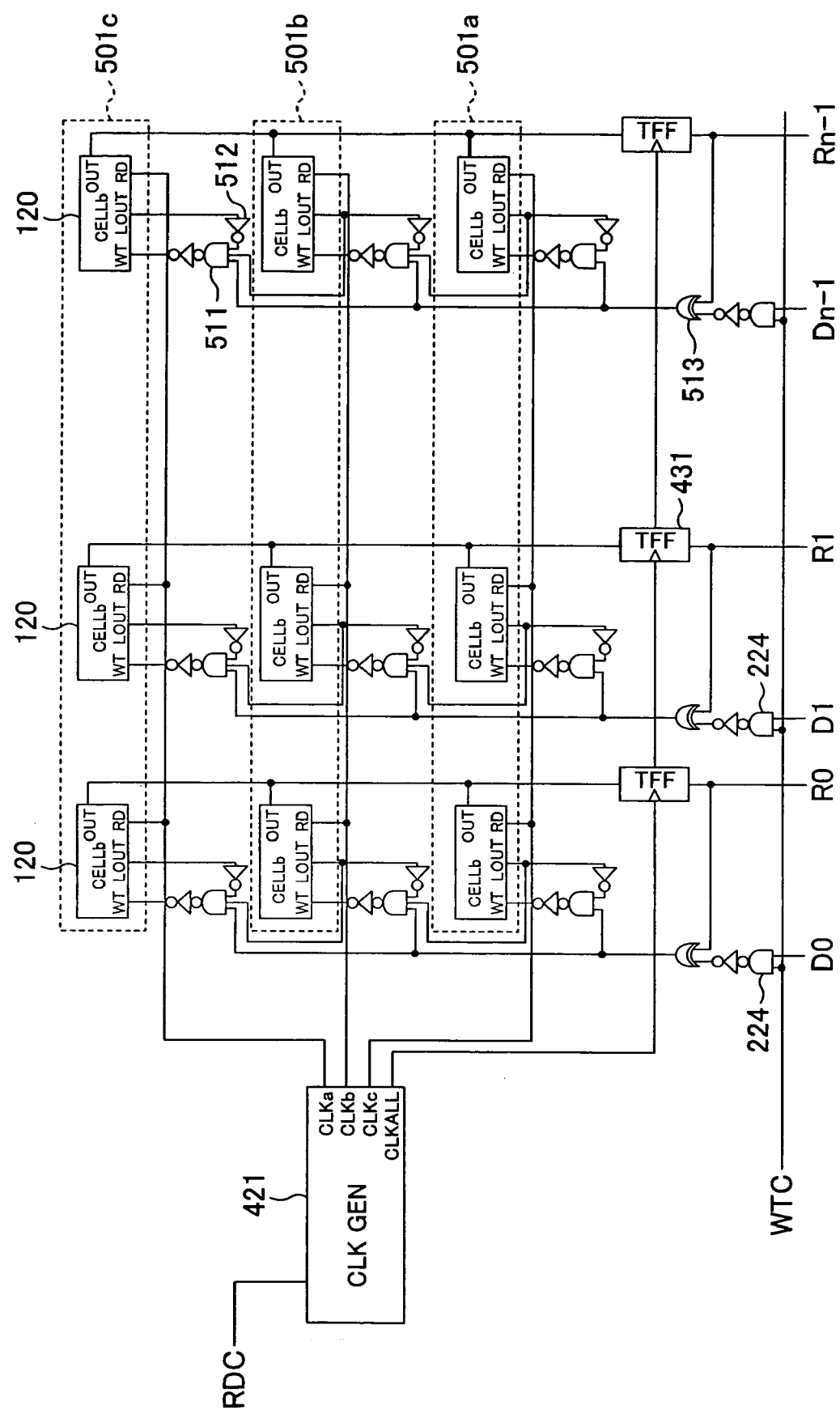
FIG. 9 is a circuit diagram illustrating a configuration of a semiconductor memory device according to the fourth embodiment.

As shown in FIG. 9, the semiconductor memory device including the bit cells 120 (CELLb) is configured such that, for each bit, an output from an AND circuit 224 and an output from a T flip-flop 431 are input to an XOR circuit 513 and a High signal is generated when these outputs are different.

In addition, the semiconductor memory device is configured such that an output from the XOR circuit 513, a signal inverted by a NOT circuit 512 from a LOUT signals output from each of the bit cells 120 and a LOUT signal output from the bit cell 120 at its previous stage (at the stage immediately below in FIG. 9) are input to an AND circuit 511 and a WT signal is generated.

With the foregoing configuration, for each bit, if read-out data at the current time and write data are different, the fuse 101 is blown. Out of the bit cells 120 associated with one bit, the bit cell 120 including the fuse 101 which has not been blown yet and located immediately after the bit cell 120 including the fuse 101 which has been blown is selected as the bit cell 120 including the fuse next to be blown. Accordingly, only by inputting data to be written, the fuse 101 in an appropriate bit cell 120 is automatically blown, and additional writing is completed.

The state of each of the bit cells 120 in which data has been written in the manner described above is the same as that in the semiconductor memory device of the third embodiment. Read operation is also performed by setting an RDC signal at High in the same manner.

EMBODIMENT 5

In the foregoing embodiments, examples of a semiconductor memory device in/from which n-bit data is stored and read out are described. Alternatively, a plurality of similar data bit cell groups may be provided such that data of a plurality of words is selectively stored and read out according to an address signal.

Figure 10:
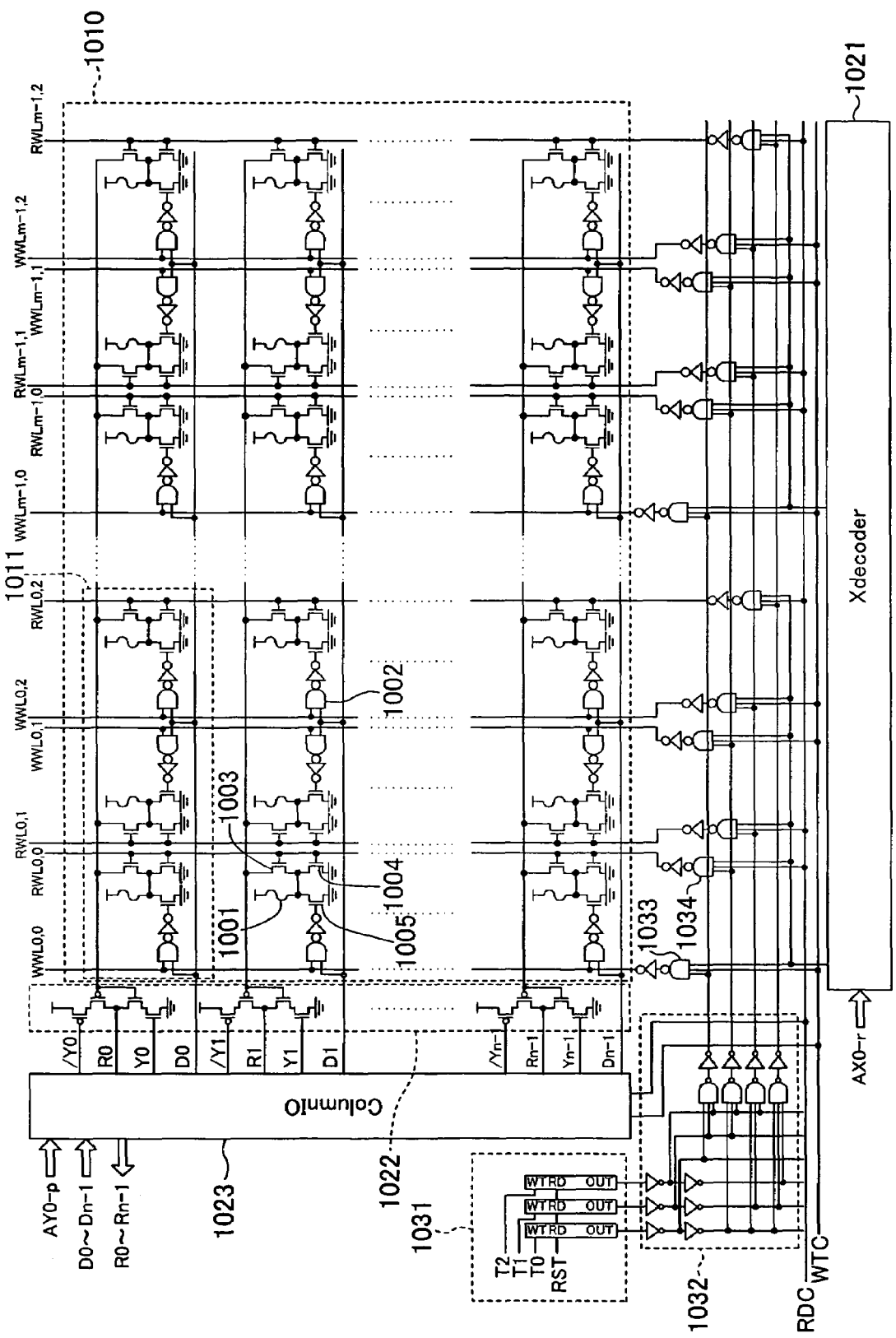
FIG. 10 is a circuit diagram illustrating a configuration of a semiconductor memory device according to a fifth embodiment of the present invention.

Specifically, as shown in FIG. 10, for example, a memory cell array 1010 of a semiconductor memory device according to a fifth embodiment of the present invention includes n (n bits)×m data bit cell groups 1011 in each of which data is capable of being written three times. Each of the data bit cell groups 1011 includes: three fuses 1001; three AND circuits 1002; three pairs of read transistors 1003 and 1004; and three write transistors 1005.

Selection of one of the n×m data bit cell groups 1011 is determined based on a decoding result of an address signal AX0-r by a decoder 1021. As in the first and second embodiments, which one of the data bit cell groups 1011 is to be selected is determined according to selection signals generated by a cell-group specifying circuit 1031 and a decoder 1032. Specifically, a selection signal output from the decoder 1032 and a decoded signal output from the decoder 1021 are input to AND circuits 1033 and 1034, and a write signal WWL0, 0 or a read signal RWL0, 0, for example, is generated. In the example shown in FIG. 10, write signals T0 through T2 input from the outside are used as WT signals for the bit cells in the cell-group specifying circuit 1031. However, the present invention is not limited to this example. As in the first and second embodiment, the WT signals may be automatically selected according to the decoding result of the decoder 1032.

In reading stored data, a voltage output from a bit cell selected according to, for example, the read signal RWL0, 0 to a bit line through the read transistor 1003 is amplified to a given potential by a sense amplifier sequence 1022 driven (having its activation/deactivation determined) using a Y-signal line, for example, is decoded and buffered through a column IO circuit 1023, and is output as read-out data signals R0 through Rn−1.

In writing data, fuses 1001 in bit cells selected according to, for example, the write signal WWL0, 0 are blown with current flowing through the write transistors 1005 based on write data signals D0 through D−1 input through the column 10 circuit 1023.

As described above, the bit cells are arranged in an array, so that data is capable of being written three times as in the first and second embodiments and, in addition, one of m sets of n-bit data is selectively read out according to an address signal.

The components described in the foregoing embodiments and the following modified examples may be used in any logically-allowable combination. Specifically, the bit cells 120 outputting data according to the number of blown fuses 101 as described in the third and fourth embodiments, for example, may be arranged in an array such that data is read out according to an address signal in the manner as that in the fifth embodiment.

In the first embodiment, an RDC signal for initialization may be input to only one of the data bit cell groups 201a through 201c selected according to selection signals 211 through 214, as in the second embodiment.

In the first and second embodiments, as elements generating WT signals to be input to the bit cells 100/110, the transfer gates 221, for example, are used in the first embodiment and the AND circuits 321, for example, are used in the second embodiment. Alternatively, AND circuits may be used in the first embodiment or transfer gates may be used in the second embodiment.

In the examples described above, the fuses 101 in the cell-group specifying circuit 202 are blown when a write completion signal A is set at High. Alternatively, the fuses may be blown only by setting a WTC signal at High with the write completion signal A fixed at High or only by setting the WTC signal (or the write completion signal A) at High with the WTC signal (or the write completion signals A) directly input to the transfer gates 222. Write operation may be performed only by making write data signals D0 through Dn−1 directly input to the transfer gate 221, for example, and setting these write data signals D0 through Dn−1 at High.

In the examples described above, read-out data signals R0 through Rn−1 and write data signals D0 through Dn−1 are provided separately. However, the present invention is not limited to this, and a data line serving both as a write data signal line and a read-out data signal line and switching between these lines according to, for example a WTC signal may be used, for example.

In the configuration in which out of the data bit cell groups 201a through 201c, a data bit cell group for writing data is different from that for reading data, once a state in which data is read out is set, prevention of unintentional rewriting of stored data is ensured. However, the present invention is not limited to this configuration, and data may be written in and read out from the same data bit cell group. In this case, in rewriting in which the number of fuses 101 to be blown increases, data is rewritten without switching to the next one of the data bit cell groups 201a through 201c. In addition, if data is rewritten three times as in the above examples, it is sufficient to provide only two bit cells 100 in the cell-group specifying circuit 202. Alternatively, the same cell-group specifying circuit 202 may not be used for reading and writing.

The configuration of the decoder 203 is not limited to that shown in FIG. 2, for example. In particular, signals output from the bit cells 100 in the cell-group specifying circuit 202 are inverted only once according to blowing of the fuses 101, and the number of patterns of signals input to the decoder 203 is only four. Accordingly, the configuration may be further simplified in actual application.

In the case where the latch circuits 331 connected to the outputs of the bit cells 110 are provided as in the second embodiment, only inverters and buffers may be provided instead of the latch circuits 106 in the bit cells 110.

In the third embodiment, the bit cells 110 have their outputs connected to each other and signals output from the bit cells 110 are input (as data) to the T flip-flop 431. Alternatively, for example, the bit cells 100 may be used such that the outputs of the bit cells 100 are synthesized and input by an OR circuit. To count the number of the bit cells 100, for example, in which the fuses 101 have been blown, such a synthesized signal may be input as a clock signal of the T flip-flop 431.

The clock generator 421 is not limited to that illustrates FIG. 6. Alternatively, instead of an RDC signal, one-shot pulses similar to those output from the AND circuit 421c may be input, a shift register may be used, or CLKa through CLKc, for example, may be input without provision of the clock generator.

In the fourth embodiment, the XOR circuit 513 determines whether the fuses 101 need to be blown or not and the AND circuit 511 selects a bit cell 120 including a fuse to be blown. Alternatively, one of the determination and the selection may be performed according to a signal supplied from the outside, as in the third embodiment.

In the fifth embodiment, n×m data bit cell groups 1011 are provided to output n-bit data. Alternatively, data having a bit number smaller than n may be selected according to an address signal AY0-p input in addition to the address signal AX0-r, for example.

The semiconductor memory device of, for example, the first embodiment may be configured to allow the outputs from the bit cells 100 included in circuits such as the cell-group specifying circuit 202 to be referred to from outside the device so that the number of writing is easily known.

As disclosed in U.S. Pat. No. 5,966,339, outputs from a plurality of bit cells, for example, are not necessarily input to an XOR circuit so as to output data according to the number of blown fuses, but may be input to an AND circuit whose one input signal is inverted. That is, if the order of blowing the fuses in two bit cells, for example, both of the state in which only one of the fuses is blown and the state in which only the other is blown do not need to be taken into consideration. Accordingly, the logic can be simplified as compared to the case of using an XOR circuit.

As described above, according to the present invention, in a semiconductor memory device such as a nonvolatile memory using a storage device called, for example, an OTP device capable of rewriting stored information only once using fuses, rewriting is performed a plurality of times without a large increase of the circuit scale. The present invention provides advantages of enabling rewriting for all bits, additional writing of individual bits and/or array-type rewriting. Accordingly, a semiconductor memory device according to the present invention is useful as a semiconductor memory device such as a nonvolatile memory.

What is claimed is:

1. A semiconductor memory device, comprising:
a plurality of data storage cells in which data is capable of being written only once; and
a read selecting circuit including one or more selection storage cells in each of which data is capable of being written only once and selecting at least one of the data storage cells according to data written in the selection storage cells so as to output data according to data written in said at least one of the data storage cells selected by the read selecting circuit.

2. The semiconductor memory device of claim 1, wherein the read selecting circuit is configured to select and output at least one of signals output from the data storage cells.

3. The semiconductor memory device of claim 1, wherein the read selecting circuit is configured to select at least one of the data storage cells and supply a read signal to said at least one of the data storage cells selected by the read selecting circuit.

4. The semiconductor memory device of claim 1, further comprising a write selecting circuit including one or more selection storage cells in each of which data is capable of being written only once and selecting at least one of the data storage cells according to data written in the selection storage cells so as to write data in said at least one of the data storage cells selected by the write selecting circuit.

5. The semiconductor memory device of claim 4, wherein the read selecting circuit and the write selecting circuit are configured to share the same selection storage cells.

6. The semiconductor memory device of claim 5, wherein the write selecting circuit is configured to select, for writing, one of the data storage cells different from one of the data storage cells from which data is read out by the read selecting circuit.

7. The semiconductor memory device of claim 4, wherein the number of the selection storage cells included in the write selecting circuit is two or more, and
the write selecting circuit is configured to select at least one of the data storage cells in which data is to be written and one of the selection storage cells in the write selecting circuit, according to data written in the selection storage cells.

8. A semiconductor memory device, comprising:
a plurality of data storage cells in each of which data is capable of being written only once;
a write selecting circuit for selecting at least one of the data storage cells and writing data in said at least one of the data storage cells selected by the write selecting circuit; and
a read circuit including a flip-flop and outputting data according to the number of data storage cells in which data has been written out of the data storage cells, the flip-flop inverting an output signal thereof according to whether or not data is written in each of the data storage cells at every pulse of a pulse signal in which the number of pulses accords with the number of all the data storage cells.

9. The semiconductor memory device of claim 8, wherein the write selecting circuit is configured to select at least one of the data storage cells in which data is to be written, based on data written in the data storage cells, in inverting data output from the read circuit.

10. The semiconductor memory device of claim 8, wherein in a state in which out of two of the data storage cells in successive priorities for writing, data has been written in one of the data storage cells and data has not been written yet in the other, the write selecting circuit selects the data storage cell in which data has not been written yet.

11. The semiconductor memory device of claim 1, wherein the data storage cells are provided in a plurality of sets such that data having a given bit length is allowed to be output.

12. The semiconductor memory device of claim 8, wherein the data storage cells are provided in a plurality of sets such that data having a given bit length is allowed to be output.

13. The semiconductor memory device of claim 11, wherein the data storage cells associated with the given bit length are provided in a plurality of groups associated with a plurality of words such that data of words according to an address signal is output.

14. The semiconductor memory device of claim 12, wherein the data storage cells associated with the given bit length are provided in a plurality of groups associated with a plurality of words such that data of words according to an address signal is output.

15. A semiconductor memory device, comprising:
a plurality of data storage cell groups each including a plurality of data storage cells in each of which data is capable of being written only once;
a plurality of selection storage cells in each of which data is capable of being written only once;
a decoder for decoding outputs from the selection storage cells; and
a read selecting circuit for selecting one of the data storage cell groups according to an output from the decoder and outputting data according to data written in said one of the data storage cell groups selected by the read selecting circuit.

* * * * *